US012677499B2

(12) United States Patent
Jang et al.

(10) Patent No.: US 12,677,499 B2
(45) Date of Patent: Jul. 7, 2026

(54) SEMICONDUCTOR DEVICE INCLUDING BONDED SUBSTRATES AND MANUFACTURING METHOD THEREOF

(71) Applicant: SAMSUNG ELECTRONICS CO., LTD., Suwon-si (KR)

(72) Inventors: Minho Jang, Suwon-si (KR); Doowon Kwon, Suwon-si (KR); Doyeon Kim, Suwon-si (KR); GwideokRyan Lee, Suwon-si (KR); Kyungtae Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 332 days.

(21) Appl. No.: 18/384,025

(22) Filed: Oct. 26, 2023

(65) Prior Publication Data

US 2024/0363665 A1      Oct. 31, 2024

(30) Foreign Application Priority Data

Apr. 26, 2023      (KR) ......................... 10-2023-0054603

(51) Int. Cl.
| | |
|---|---|
| *H10F 39/00* | (2025.01) |
| *H10W 20/00* | (2026.01) |
| *H10W 20/20* | (2026.01) |
| *H10W 90/00* | (2026.01) |

(52) U.S. Cl.
CPC ......... *H10F 39/809* (2025.01); *H10F 39/811* (2025.01); *H10W 20/023* (2026.01); *H10W 20/20* (2026.01); *H10W 90/792* (2026.01)

(58) Field of Classification Search
CPC ............................ H10F 39/809; H10W 20/20

USPC ......................................................... 257/443
See application file for complete search history.

(56) References Cited

U.S. PATENT DOCUMENTS

| | | | |
|---|---|---|---|
| 11,201,185 | B2 | 12/2021 | Mitsuhashi et al. |
| 11,411,036 | B2* | 8/2022 | Kameshima .......... H10F 39/809 |
| 11,482,556 | B2 | 10/2022 | Takahashi et al. |
| 2022/0028834 | A1* | 1/2022 | Lee ..................... H01L 25/0657 |
| 2022/0077215 | A1 | 3/2022 | Horikoshi |
| 2022/0181364 | A1 | 6/2022 | Miyake et al. |

(Continued)

FOREIGN PATENT DOCUMENTS

| | | |
|---|---|---|
| KR | 10-2022-0025812 A | 3/2022 |
| WO | WO 2021/256142 A1 | 12/2021 |

*Primary Examiner* — Ajay Arora
(74) *Attorney, Agent, or Firm* — Fish & Richardson P.C.

(57) ABSTRACT

A semiconductor device includes a first substrate having a first semiconductor layer with a first electronic element, a first insulation layer on the first semiconductor layer, a first conductive pad in the first insulation layer and exposed through a first side of the first substrate, and a first wire in the first insulation layer connected to the first semiconductor layer, and a second substrate attached to the first side of the first substrate and having a second semiconductor layer with a second electronic element, a second insulation layer on the second semiconductor layer, a second wire in the second insulation layer, a through via penetrating the second semiconductor layer and connected to the second wire, and a second conductive pad connecting the through via and the first conductive pad of the first substrate, at least a part of the second conductive pad being in the second semiconductor layer.

20 Claims, 26 Drawing Sheets

(56) References Cited

U.S. PATENT DOCUMENTS

2022/0367552 A1    11/2022  Kitano
2023/0395567 A1*  12/2023  Um ..................... H01L 25/0657

* cited by examiner

SEMICONDUCTOR DEVICE INCLUDING BONDED SUBSTRATES AND MANUFACTURING METHOD THEREOF

CROSS-REFERENCE TO RELATED APPLICATION

This application claims priority to and the benefit of Korean Patent Application No. 10-2023-0054603, filed in the Korean Intellectual Property Office on Apr. 26, 2023, the entire contents of which are incorporated herein by reference.

BACKGROUND

1. Field

The present disclosure relates to a semiconductor device with bonded substrates and a manufacturing method thereof.

2. Description of the Related Art

A copper-to-copper hybrid bonding, a technology that bonds two copper pad surfaces together using a combination of heat and/or compression bonding and an electroplating, may be used to generate high performance interconnects between semiconductor chips and wafers. The copper-to-copper hybrid bonding offers several advantages over the traditional bonding technologies, e.g., over wire bonding or a flip chip bonding. It provides a more direct and stable electrical connection between the two surfaces, which may lead to improved performance and reduced power consumption, and finer pitch connections because the bonding pads may be disposed closer together.

The copper to copper hybrid bonding may be used to realize an integrated semiconductor device by mutually bonding semiconductor chips or wafers that perform different functions, e.g., an image sensor that is a semiconductor device that converts optical images into electric signals.

SUMMARY

Aspects of embodiments provide a semiconductor device, including a first substrate having a first side and a second side that is opposite to the first side, and including a first electronic element provided in a first semiconductor layer and a first wire provided in a first insulation layer; and a second substrate attached to the first side of the first substrate, and including a second electronic element provided in a second semiconductor layer and a second wire provided in a second insulation layer, wherein the first substrate is connected to the first wire and includes a first conductive pad exposed through the first side, the second substrate includes a through via penetrating the second semiconductor layer and connected to the second wire and a second conductive pad for connecting the through via and the first conductive pad, and at least part of the second conductive pad is disposed in the second semiconductor layer.

Other aspects of embodiments provide a semiconductor device, including a first semiconductor substrate having a first side and a second side that is opposite to the first side, and including a pixel array region and an edge region; an antireflective structure disposed on the second side; a pixel separator disposed on the first semiconductor substrate and separating pixels; a color filter disposed on the antireflective structure; a micro lens array disposed on the color filter; a first interlayer insulating layer disposed on a first side of the first semiconductor substrate; a first wiring layer disposed in first interlayer insulating layer; a second semiconductor substrate disposed below the first interlayer insulating layer; a second interlayer insulating layer disposed below the second semiconductor substrate; a second wiring layer disposed in the second interlayer insulating layer; a third interlayer insulating layer disposed below the second interlayer insulating layer; a third wiring layer disposed below the third interlayer insulating layer; a third semiconductor substrate disposed below the third interlayer insulating layer; a through via and a conductive pad penetrating the second semiconductor substrate and connecting the second wiring layer to the first wiring layer; and a through hole insulating layer disposed between the conductive pad and the second semiconductor substrate and between the through via and the second semiconductor substrate.

Other aspects of embodiments provide a method for manufacturing a semiconductor device, including performing a FEOL process on a semiconductor substrate having a first side and a second side that is opposite to the first side; forming a first hole penetrating an interlayer insulating layer formed on a first side of the semiconductor substrate and entering into at least a portion of the semiconductor substrate; forming a through hole insulating layer for covering a lateral side and a bottom side of the first hole by conformally depositing an insulating material on the interlayer insulating layer; forming a via metal for filling a second hole, which is formed in the through hole insulating layer formed along a profile of the first hole; forming a through via by polishing the via metal and separating the same; forming a wire on the through via; forming first to third rear insulation layers on a second side of the semiconductor substrate; forming a groove penetrating the first to third rear insulation layers and the through hole insulating layer and exposing the through via; and forming a conductive pad for filling the groove.

BRIEF DESCRIPTION OF THE DRAWINGS

Features will become apparent to those of skill in the art by describing in detail exemplary embodiments with reference to the attached drawings, in which:

FIG. 3 shows a cross-sectional view of a semiconductor device according to an embodiment.

DETAILED DESCRIPTION

Exemplary embodiments will be described more fully hereinafter with reference to the accompanying drawings.

Figure 1:
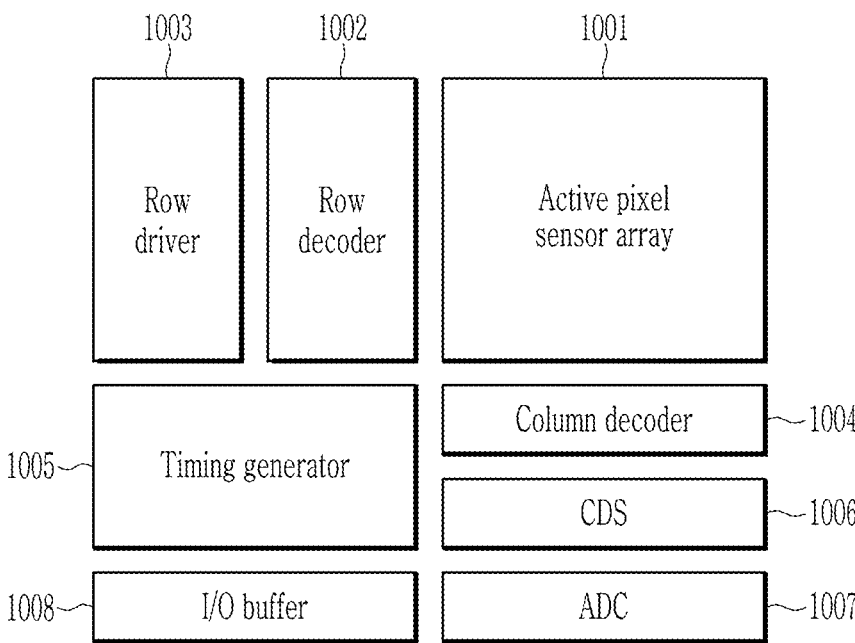
FIG. 1 shows a block diagram of a semiconductor device according to an embodiment.

FIG. 1 shows a block diagram of a semiconductor device according to an embodiment. The embodiment hereinafter will be described with respect to an image sensor but may be implemented in any semiconductor device manufactured by mutually bonding semiconductor substrates.

Referring to FIG. 1, a semiconductor device (e.g., an image sensor) may include an active pixel sensor array 1001, a row decoder 1002, a row driver 1003, a column decoder 1004, a timing generator 1005, a correlated double sampler (CDS) 1006, an analog to digital converter (ADC) 1007, and an input and output (I/O) buffer 1008.

The active pixel sensor array 1001 may include a plurality of unit pixels arranged in a two-dimensional (2D) way, and may convert optical signals into electrical signals. The active pixel sensor array 1001 may be driven by a plurality of driving signals, e.g., a pixel selection signal, a reset signal, and a charge transmitting signal, from the row driver 1003. The converted electrical signals may be provided to the CDS 1006.

The row driver 1003 may provide driving signals for driving unit pixels to the active pixel sensor array 1001 according to decoded results by the row decoder 1002. When the unit pixels are arranged in a matrix form, the driving signals may be provided for respective rows.

The timing generator 1005 may provide timing signals and control signals to the row decoder 1002 and the column decoder 1004.

The CDS 1006 may receive the electric signals generated by the active pixel sensor array 1001 and may hold and sample them. The CDS 1006 may sample a specific noise level and a signal level caused by the electrical signal, and may output a difference level that corresponds to a difference between the noise level and the signal level.

The ADC 1007 may convert an analog signal that corresponds to the difference level output by the CDS 1006 into a digital signal and may output the digital signal.

The I/O buffer 1008 may latch the digital signal, and may sequentially output the latched signal to a video signal processor as digital signals according to a decoding result by the column decoder 1004.

Figure 2:
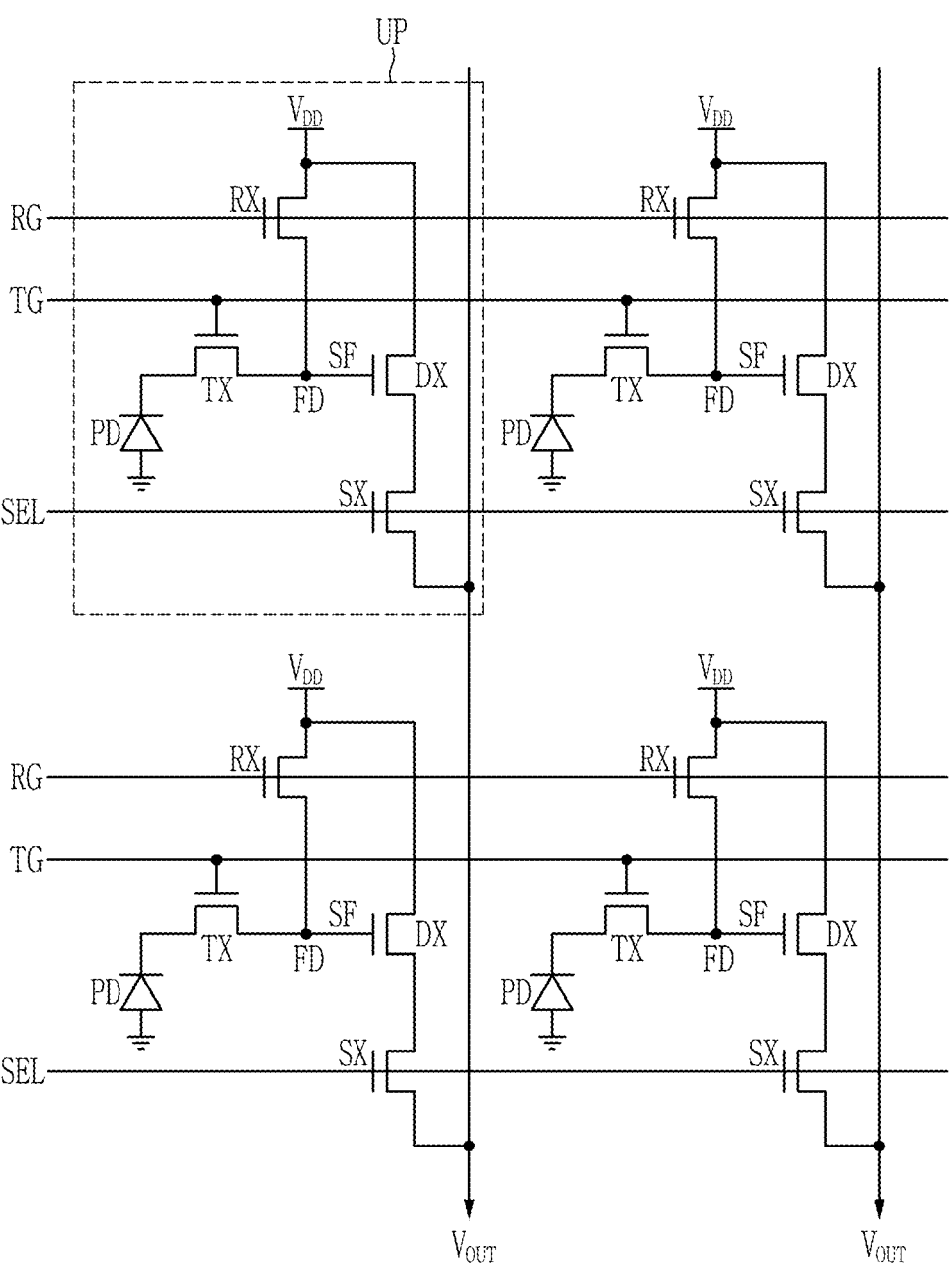
FIG. 2 shows a circuit diagram of an active pixel sensor array of a semiconductor device according to an embodiment.

FIG. 2 shows a circuit diagram of the active pixel sensor array 1001 according to an embodiment.

Referring to FIG. 1 and FIG. 2, the sensor array 1001 may include unit pixels UP, and the unit pixels UP may be arranged in a matrix format. Each of the respective unit pixels UP may include a transmission transistor TX and logic transistors RX, SX, and DX. The logic transistors may include a reset transistor RX, a selection transistor SX, and/or a source follower transistor DX. The transmission transistor TX may include a transmission gate TG. The respective unit pixels UP may further include a photoelectric converter PD and a floating diffusing region FD. The logic transistors RX, SX, and DX may be shared with each other for the respective unit pixels UP.

The photoelectric converter PD may generate and store photocharges in proportion to an amount of light input from outside. The photoelectric converter PD may include, e.g., a photodiode, a phototransistor, a photogate, a pinned photodiode, and combinations thereof. The transmission transistor TX may transmit the charges generated by the photoelectric converter PD to the floating diffusing region FD. The floating diffusing region FD may receive the charges generated by the photoelectric converter PD and may store them in an accumulative way. The source follower transistor DX may be controlled according to the amount of photocharges accumulated in the floating diffusing region FD.

The reset transistor RX including a reset gate electrode RG may periodically reset the charges accumulated in the floating diffusing region FD. A drain electrode of the reset transistor RX may be connected to the floating diffusing region FD, and a source electrode may be connected to the power source voltage VDD. When the reset transistor RX is turned on, the power source voltage VDD connected to the source electrode of the reset transistor RX may be applied to the floating diffusing region FD. Therefore, when the reset transistor RX is turned on, the charges accumulated in the floating diffusing region FD may be discharged and the floating diffusing region FD may be reset.

The source follower transistor DX including a source follower gate electrode SF may function as a source follower buffer amplifier. The source follower transistor DX may amplify a potential change in the floating diffusing region FD, and may output the same to an output line Vout.

The selection transistor SX including a selection gate electrode SEL may select the unit pixels UP to be read for respective rows. When the selection transistor SX is turned on, the power source voltage VDD may be applied to a drain electrode of the source follower transistor DX.

The semiconductor device with the active pixel sensor array 1001 may be provided by bonding three semiconductor substrates.

Figure 3:
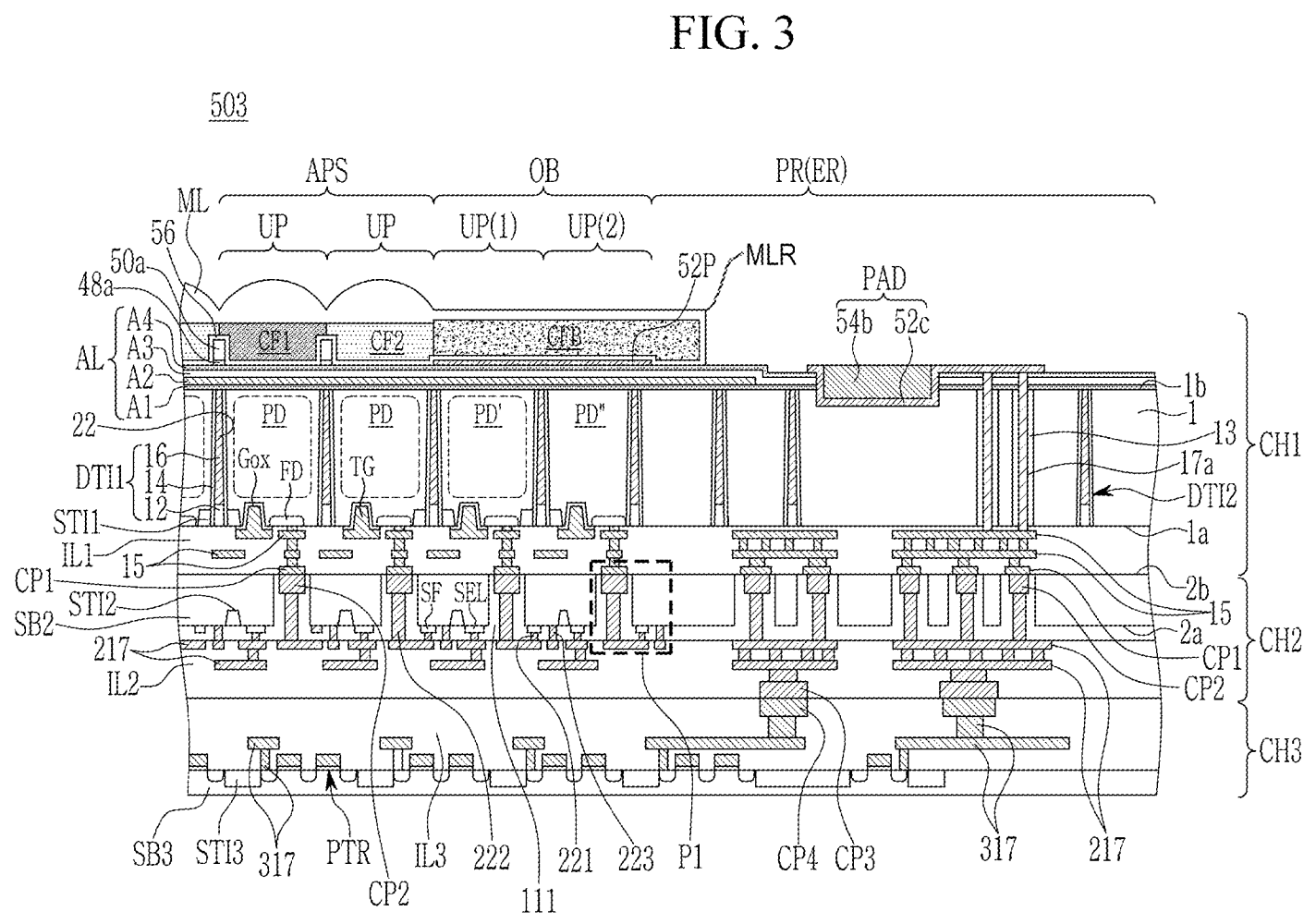
Figure 4:
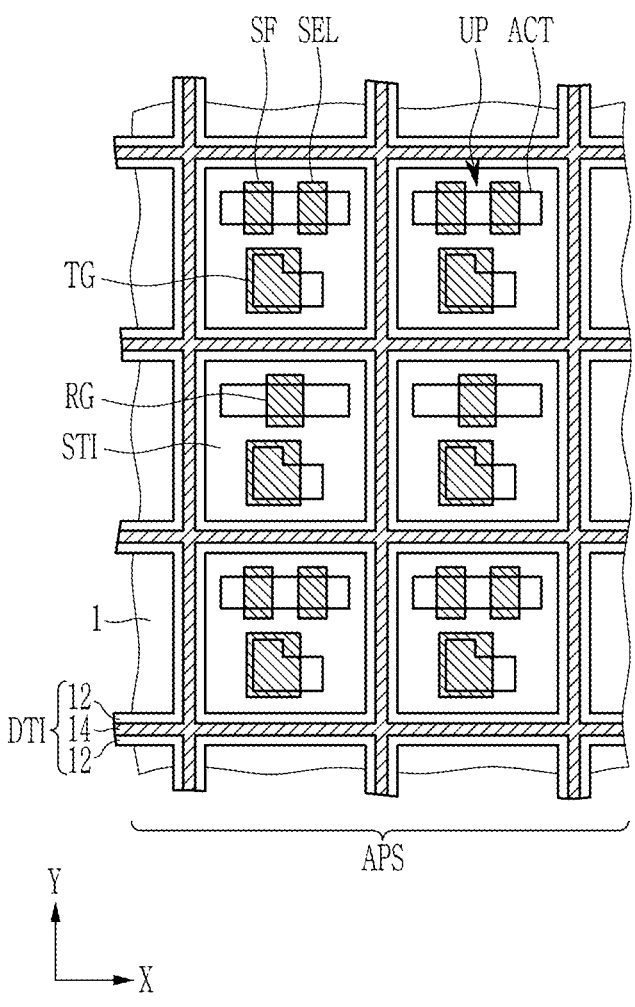
FIG. 4 shows a partial top plan view of a semiconductor device according to an embodiment.
Figure 5:
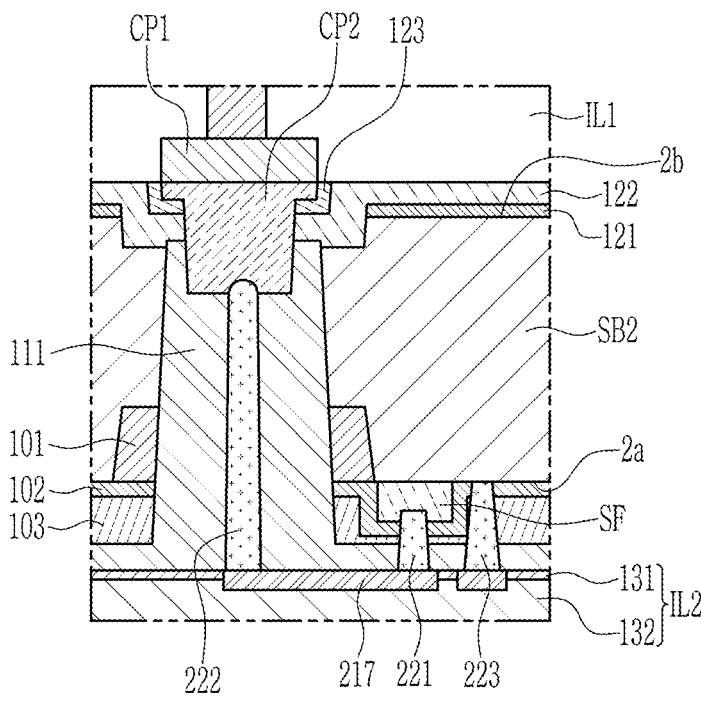
FIG. 5 shows an enlarged portion P1 of FIG. 3.

FIG. 3 shows a cross-sectional view of a semiconductor device according to an embodiment, FIG. 4 shows a partial top plan view of a semiconductor device according to an embodiment, and FIG. 5 shows an enlarged portion P1 of FIG. 3.

Referring to FIGS. 3-5, an image sensor 503 according to an embodiment may have a structure in which first to third sub-chips CH1 to CH3 are sequentially bonded. The respective first to third sub-chips CH1 to CH3 may be referred to as first to third substrates.

The first sub-chip CH1 (i.e., the first substrate) may function to sense images. The first sub-chip CH1 may include a first semiconductor layer 1. For example, the first semiconductor layer 1 may be a silicon monocrystalline wafer, a silicon epitaxial layer, or a silicon on insulator (SOI) substrate. For example, the first semiconductor layer 1 may be doped with first conductivity type impurities. For example, the first conductivity type may be a p-type. The first semiconductor layer 1 includes a front side 1a (e.g., a first side) and a rear side 1b (e.g., a second side) that are opposite to each other. The first semiconductor layer 1 may include a pixel array region APS, an optical black region OB, and an edge region ER. For example, pixel array region APS may be the active pixel sensor array 1001 of FIG. 1.

The pixel array region APS and the optical black region OB may respectively include unit pixels UP. The optical black region OB may surround the pixel array region APS. The edge region ER may surround the pixel array region APS and the optical black region OB. The edge region ER may include a pad region PR. The pad region PR may be disposed on an outermost portion in the edge region ER.

A first pixel separator DTI1 may be disposed in the first semiconductor layer 1 to separate/limit the unit pixels UP in the pixel array region APS and the optical black region OB. The first pixel separator DTI1 may extend to the pad region PR of the edge region ER. The first pixel separator DTI1 may have a mesh shape. A second pixel separator DTI2 may be disposed in the first semiconductor layer 1 in the edge region ER.

The first pixel separator DTI1 and the second pixel separators DTI2 are disposed in a deep trench 22 formed toward the rear side 1b from the front side 1a of the first semiconductor layer 1. The first pixel separator DTI1 and the second pixel separators DTI2 may be frontside deep trench isolations (FDTI). The first pixel separator DTI1 and the second pixel separators DTI2 may respectively include a buried insulation pattern 12, a separated insulation pattern 14, and a separated conductive pattern 16. The buried insulation pattern 12 may be provided between the separated conductive pattern 16 and the first interlayer insulating layer IL1. The separated insulation pattern 14 may be provided between the separated conductive pattern 16 and the first semiconductor layer 1 and between the buried insulation pattern 12 and the first semiconductor layer 1.

The buried insulation pattern 12 and the separated insulation pattern 14 may be made of an insulating material with a refractive index that is different from that of the first semiconductor layer 1. The buried insulation pattern 12 and the separated insulation pattern 14 may include, e.g., a silicon oxide. The separated conductive pattern 16 may be spaced from the first semiconductor layer 1. The separated conductive pattern 16 may include a polysilicon film or a silicon germanium film to which impurities are doped. The impurities doped into the polysilicon or the silicon germanium film may be, e.g., at least one of boron, phosphorus, arsenide. Alternatively, the separated conductive pattern 16 may include a metal layer.

The first pixel separator DTI1 and the second pixel separators DTI2 may respectively have a horizontal cross-section that becomes narrower when approaching the rear side 1b from the front side 1a of the first semiconductor layer 1. The second pixel separator DTI2 may be referred to as a substrate separator.

The photoelectric converters PD may be respectively disposed on the first semiconductor layer 1 on the unit pixels UP. The photoelectric converters PD may be doped with second conductivity type impurities that are opposite the first conductivity type. For example, the second conductivity type may be an n-type. The n-type impurities doped into the photoelectric converters PD may configure a PN junction with the p-type impurities doped into the peripheral first semiconductor layer 1 to provide a photodiode.

First element separators STI1 provided near the front side 1a may be disposed on the first semiconductor layer 1. The first element separators STI1 may be penetrated by the first pixel separator DTI1. The first element separators STI1 may limit active regions disposed near the front side 1a on the respective unit pixels UP. The active regions may be provided for the transistors TX, RX, DX, and SX of FIG. 2.

Referring to FIG. 3, the transmission gate TG may be disposed on the front side 1a of the first semiconductor layer 1 on the respective unit pixels UP. For example, a portion of the transmission gate TG may extend into the first semiconductor layer 1. The transmission gate TG may be a vertical type. In another example, the transmission gate TG may not extend into the first semiconductor layer 1 and may be a planar type. A gate insulating layer Gox may be provided between the transmission gate TG and the first semiconductor layer 1. A floating diffusing region FD may be disposed in the first semiconductor layer 1 on one side of the transmission gate TG. For example, second conductivity type impurities may be doped into the floating diffusing region FD.

The image sensor 503 may be a rear side light-receiving image sensor. Light may be input into the first semiconductor layer 1 through the rear side 1b of the first semiconductor layer 1. Electron-hole pairs may be generated at the PN junction by the input light. The above-generated electrons may move to the photoelectric converters PD. When a voltage is applied to the transmission gate TG, the electrons may move to the floating diffusing region FD.

The first sub-chip CH1 may include transmission gates TG and first interlayer insulating layers IL1 covering the same on the front side 1a of the first semiconductor layer 1. The first element separator STI1 may be disposed on the first semiconductor layer 1 to define active regions. The first sub-chip CH1 may further include internal connection vias 17a. The internal connection vias 17a may penetrate the first semiconductor layer 1 in the edge region ER to connect between a first pad connector made of first wires 15 and a rear side conductive pad PAD. A separated insulation pattern 13 for an insulation from the first semiconductor layer 1 may be disposed around the internal connection vias 17a. A first conductive pad CP1 may be disposed on a lowermost portion of the first interlayer insulating layer IL1. The first conductive pad CP1 may include copper.

The second sub-chip CH2 (i.e., the second substrate) may include a second semiconductor layer SB2, selection gates SEL, source follower gates SF, and reset gates disposed on a front side 2a of the second semiconductor layer SB2, and second interlayer insulating layers IL2 covering them. A second element separator STI2 may be disposed on the second semiconductor layer SB2 to define active regions, and an additional floating diffusing region may be disposed in the active regions. A plurality of through holes may be disposed in the second semiconductor layer SB2, and through vias 222 may be disposed in the through holes. A second conductive pad CP2 may be disposed on the through via 222 and may be exposed through a rear side 2b of the second semiconductor layer SB2. The second conductive pad CP2 may contact the first conductive pad CP1 of the first sub-chip CH1. A through hole insulating layer 111 may be filled around the through via 222 and the second conductive pad CP2. The through hole insulating layer 111 may be conformally disposed on the front side 2a of the second semiconductor layer SB2. Second wires 217 including a via 221 connected to the source follower gate SF and a via 223 connected to the active region of the second semiconductor layer SB2, and a third conductive pad CP3 may be disposed in the through hole insulating layer 111 and the second interlayer insulating layers IL2. The source follower gates SF may be respectively connected to the floating diffusing regions FD of the first sub-chip CH1 through the through via 222 and the second conductive pad CP2. The third conductive pad CP3 may be disposed in the edge region ER, may be connected to the through via 222 through a second pad connector made of the second wires 217, and may be connected to a first pad connector made of some of the first wires 15 through the second conductive pad CP2 and the first conductive pad CP1.

Referring to FIG. 5, the through via 222 may be disposed in a through hole passing through the second semiconductor layer SB2, and the second conductive pad CP2 may be disposed above the through via 222. The through hole insulating layer 111 may be filled around the through via 222 and the second conductive pad CP2 to insulate the second semiconductor layer SB2 from the through via 222 and the second conductive pad CP2. A lower end of the through via 222 may be connected to the second wires 217. An upper end of the through via 222 connected to the second conductive pad CP2 may have a shape of which corners are round. The through via 222 may have a cross-section of which a width increases when becoming distant from the second conductive pad CP2, and the second conductive pad CP2 may have a cross-section of which a width increases when becoming distant from the through via 222. A width of a cross-section of an upper end of the second conductive pad CP2 may increase in a stepped shape, e.g., an upper end of the cross-section of the second conductive pad CP2 may have a stepped profile, and the upper end contacting the first conductive pad CP1 may have a cross-section of which the width discontinuously increases, compared to remaining portions. The second conductive pad CP2 and the second wires 217 may include copper, and the through via 222 may include tungsten.

Referring to FIG. 5, first to third rear insulation layers 121, 122, and 123 may be disposed on the rear side 2b of the second semiconductor layer SB2. For example, the first to third rear insulation layers 121, 122, and 123 may be arranged to separate between the rear side 2b of the second semiconductor layer SB2 and the first interlayer insulating layer IL1. The first and third rear insulation layers 121 and 123 may include a silicon oxide (SiO$_2$), and the second rear insulation layer 122 may include a silicon nitride (SiN$_x$).

In detail, the second rear insulation layer 122 may be disposed according to a profile of a groove passing through the first rear insulation layer 121 around the second conductive pad CP2 and entering part of the second semiconductor layer SB2. For example, as illustrated in FIG. 5, the second rear insulation layer 122 may extend along the rear side 2b of the second semiconductor layer SB2, and may extend into the groove extending through the first rear insulation layer 121 and into a portion of the second semiconductor layer SB2 to surround an entire perimeter of a sidewall of the second conductive pad CP2. The second rear insulation layer 122 may have a groove in an upper portion thereof for receiving the upper end of the second conductive pad CP2.

The first rear insulation layer 121 may be disposed between a portion of the second semiconductor layer SB2 and the second rear insulation layer 122. For example, as illustrated in FIG. 5, a lateral sidewall of the first rear insulation layer 121 and a portion of a lateral sidewall of the second semiconductor layer SB2 may be coplanar and may define the groove surrounding the second conductive pad CP2 and a portion of the second rear insulation layer 122.

The third rear insulation layer 123 may be disposed between the upper end of the second conductive pad CP2 and the second rear insulation layer 122 in the groove of the second rear insulation layer 122. For example, as illustrated in FIG. 5, upper surfaces of the second and third rear insulation layers 122 and 123 may be coplanar and, e.g., directly, contact the first interlayer insulating layer IL1.

Referring to FIG. 5, the source follower gate SF may be disposed on the front side 2a of the second semiconductor layer SB2, and first to third front side insulation layers 101, 102, and 103 may be disposed to surround the source follower gate SF. For example, as illustrated in FIG. 5, the second and third front side insulation layers 102 and 103 may be on the front side 2a of the second semiconductor layer SB2 to surround three surfaces of the source follower gate SF (i.e., surfaces not contacting the front side 2a of the second semiconductor layer SB2) and the first front side insulation layer 101 may be embedded in the second semiconductor layer SB2 and horizontally shifted from the source follower gate SF.

In detail, the first front side insulation layer 101 may fill a groove in the second semiconductor layer SB2 that extends from the front side 2a, and may surround a sidewall of the groove. The second front side insulation layer 102 may cover the front side 2a of the second semiconductor layer SB2, the first front side insulation layer 101, and the source follower gate SF. The third front side insulation layer 103 may cover the second front side insulation layer 102. The through hole insulating layer 111 may be disposed on, e.g., through, the second and third front side insulation layers 102 and 103. The through hole insulating layer 111 may fill a through hole through the first to third front side insulation layers 101, 102, and 103, and may conformally cover the third front side insulation layer 103.

The via 221 connected to the source follower gate SF, the via 222 connected to the second conductive pad CP2, the via 223 connected to the active region of the second semiconductor layer SB2, and second wires 217 connected to the vias 221, 222, and 223 may be disposed on the front side 2a of the second semiconductor layer SB2. The second wires 217 may be disposed on the through hole insulating layer 111 and may be disposed in the second interlayer insulating layer IL2. The second interlayer insulating layer IL2 may include a first film 131 and a second film 132. The source follower gate SF may include polysilicon, and the vias 221, 222, and 223 may include tungsten. The first and third front side insulation layers 101 and 103 may include silicon oxide (SiO$_2$), and the second front side insulation layer 102 may include silicon nitride (SiN$_x$). The through hole insulating layer 111 and the second film 132 of the second interlayer insulating layer IL2 may include silicon oxide SiO$_2$, and the first film 131 of the second interlayer insulating layer IL2 may include silicon nitride (SiN$_x$).

Referring to FIG. 3, the third sub-chip CH3 (i.e., the third substrate) may include a third semiconductor layer SB3, a peripheral transistors PTR disposed thereon, and a third interlayer insulating layers IL3 covering them. A third element separator STI3 may be disposed on the third semiconductor layer SB3 to define active regions. Third wires 317 and a fourth conductive pad CP4 may be disposed in the third interlayer insulating layers IL3. An uppermost layer of the third interlayer insulating layer IL3 contacts an uppermost layer of the second interlayer insulating layer IL2. The third sub-chip CH3 may include circuits for driving the first and/or second sub-chips CH1 and CH2 or storing electrical signals generated by the first and/or second sub-chips CH1 and CH2.

Referring to FIG. 3, an antireflective structure AL may be disposed on the rear side 1b of the first semiconductor layer 1. The antireflective structure AL may include a first insulation layer A1, a conductive film A2, a second insulation layer A3, and a third insulation layer A4 that are sequentially stacked. The first insulation layer A1, the second insulation layer A3, and the third insulation layer A4 may include different materials. In an embodiment, the first insulation layer A1 may include an aluminum oxide, the second insulation layer A3 may include a silicon oxide, and the third insulation layer A4 may include a hafnium oxide. The conductive film A2 may have electrical conductivity and may include a titanium oxide.

In the present specification, the first insulation layer A1 may be referred to as a first antireflection layer, the conductive film A2 may be referred to as a second antireflection layer, the second insulation layer A3 may be referred to as a third antireflection layer, and the third insulation layer A4 may be referred to as a fourth antireflection layer.

The first semiconductor layer 1 may have a first refractive index n1, the first insulation layer A1 may have a second refractive index n2, the conductive film A2 may have a third refractive index n3, and the second insulation layer A3 may have a fourth refractive index n4. A mean value {(n2+n3)/2} of the second refractive index n2 and the third refractive index n3 may be less than the first refractive index n1 and may be greater than the fourth refractive index n4. The first refractive index n1 may be 4.0 to 4.4. The second refractive index n2 may be 2.0 to 3.0. The third refractive index n3 may be 2.2 to 2.8. The fourth refractive index n4 may be 1.0 to 1.9.

The first insulation layer A1 may have a first thickness, the conductive film A2 may have a second thickness, the second insulation layer A3 may have a third thickness, and the third insulation layer A4 may have a fourth thickness. Here, the second thickness may be respectively greater than each of the first thickness and the fourth thickness, and may be less than the third thickness. For example, the first thickness may be 10 angstroms to 100 angstroms, the second thickness may be 100 angstroms to 600 angstroms, the third thickness may be 600 angstroms to 900 angstroms, and the fourth thickness may be 20 angstroms to 200 angstroms.

According to a relationship of the refractive indexes and/or a relationship of the thicknesses, light input to a micro lens ML may be refracted and pass through a multi-layered structure of the antireflective structure AL and may be input to the photoelectric converters PD. Hence, the image sensor 503 with clear image quality may be provided by increasing a light receiving rate.

Regarding the image sensor 503, the antireflective structure AL may include the conductive film A2 made of titanium oxide $TiO_2$, and the conductive film A2 made of titanium oxide $TiO_2$ may generally reduce reflectance of light of all colors, and may particularly further reduce the reflectance of blue light. Hence, a quantum efficiency (QE) of the blue pixel may be increased.

The first insulation layer A1 may function as a negative fixed charge layer. Hence, dark currents and white spots may be reduced.

Further, a predetermined negative potential (voltage) may be applied to the conductive film A2 so that holes (h+) may be accumulated around the rear side 1b of the first semiconductor layer 1. By this, the dark currents and the white spots may be further reduced.

A first optical black pattern 52p is disposed on the antireflective structure AL. The first optical black pattern 52p may be a single layer of at least one of a titanium layer, a titanium nitride layer, and a tungsten layer or a multilayer.

Light blocking patterns 48a may be disposed on the antireflective structure AL in the pixel array region APS. Low-refraction grid patterns 50a may be disposed on the light blocking patterns 48a, respectively. The light blocking pattern 48a and the low-refraction grid pattern 50a may vertically overlap the first pixel separator DTI1 and may have a grid form in a plan view. The light blocking pattern 48a may include, e.g., at least one of titanium and titanium nitride. The low-refraction grid pattern 50a may have a same thickness and may include a same organic material. The low-refraction grid pattern 50a may have a refractive index that is less than those of the color filters CF1 and CF2. For example, the low-refraction grid pattern 50a may have a refractive index that is equal to or less than about 1.3. The light blocking pattern 48a and the low-refraction grid pattern 50a may prevent crosstalk among adjacent unit pixels UP.

A protective layer 56 may be conformally disposed on the first optical black pattern 52p, the light blocking pattern 48a, and the low-refraction grid pattern 50a.

The color filters CF1 and CF2 may be disposed between the low-refraction grid patterns 50a on the protective layer 56 in the pixel array region APS. For example, the color filters CF1 and CF2 may have a color from among blue, green, and red. In another example, the color filters CF1 and CF2 may include other colors, e.g., cyan, magenta, or yellow. For example, regarding the image sensor 503, the color filters CF1 and CF2 may be arranged in a bayer pattern form. In another example, the color filters CF1 and CF2 may be arranged in a 2×2 tetra pattern, a 3×3 nona pattern, or a 4×4 hexadeca pattern.

The micro lenses ML may be disposed on the color filters CF1 and CF2 in the pixel array region APS. Edges of the micro lenses ML may contact each other and may be connected to each other. The micro lenses ML may configure an array. The micro lenses ML may be referred to as a micro lens array.

A lens residuary layer MLR may be disposed on a second optical black pattern CFB in the edge region ER. The lens residuary layer MLR may include the same material as the micro lenses ML. A rear side conductive pad PAD may be exposed and disposed in the pad region PR.

Figure 6:
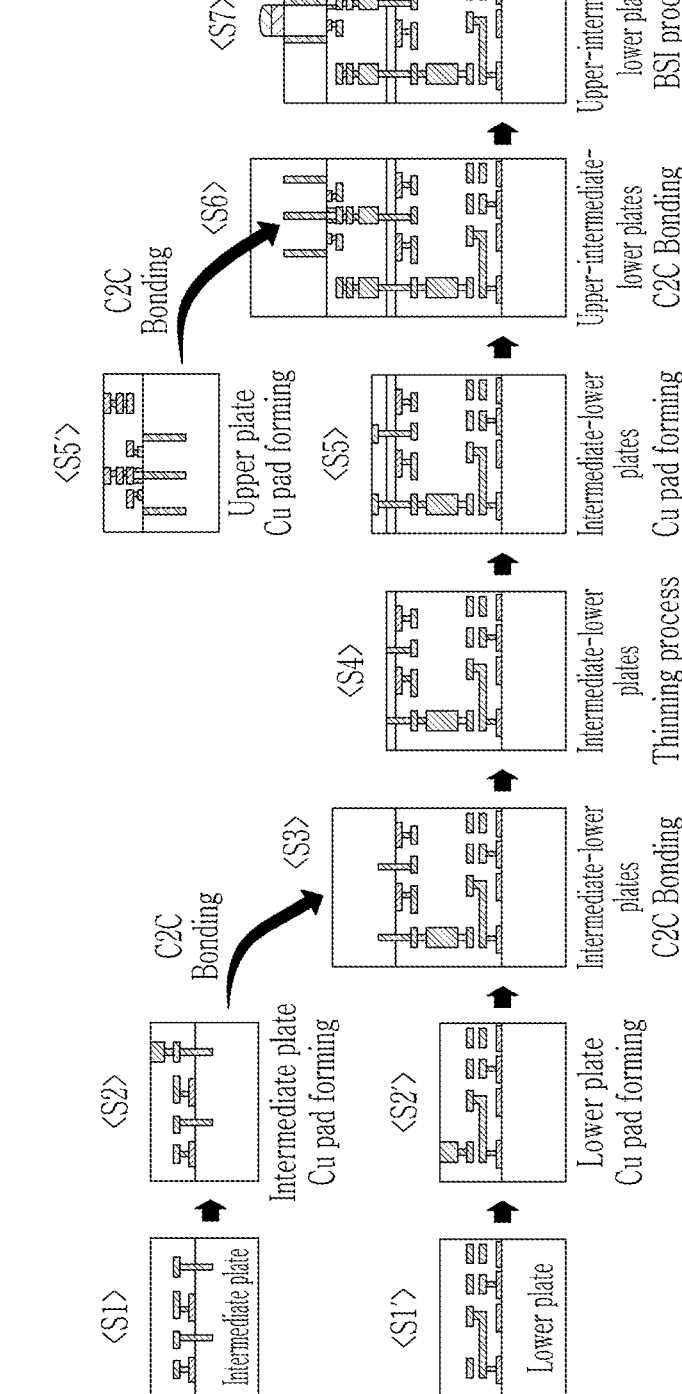
FIG. 6 shows a flow of a method for manufacturing a semiconductor device according to an embodiment.

FIG. 6 shows a flow of a method for manufacturing a semiconductor device according to an embodiment. In FIG. 6, an upper plate, an intermediate plate, and a lower plate may correspond to the first sub-chip CH1, the second sub-chip CH2, and the third sub-chip CH3, respectively.

Referring to FIGS. 3 and 6, a front end of line (FEOL) process on the intermediate plate CH2 is performed, and the through via 222 and the second wires 217 may be formed (S1). The third conductive pad CP3 connected to the second wires 217 may be formed (S2). The third conductive pad CP3 may include copper.

A front end of line (FEOL) process on the lower plate CH3 is performed, and third wires 317 may be formed (S1'). A fourth conductive pad CP4 connected to the third wires 317 may be formed (S2'). The fourth conductive pad CP4 may include copper.

The provided intermediate plate CH2 may be reversed to be bonded to the lower plate CH3 (S3). In this instance, a copper to copper (Cu to Cu) bonding may be performed between the third conductive pad CP3 and the fourth conductive pad CP4.

The second semiconductor layer SB2 of the intermediate plate CH2 bonded to the lower plate CH3 may be cut by, e.g., a chemical mechanical polishing (CMP) or an etch back, thereby reducing the thickness (S4).

The second conductive pad CP2 may be formed on the thickness-reduced second semiconductor layer SB2 (S5).

The FEOL process on the upper plate CH1 may be performed, and the first wires 15 and the first conductive pad CP1 may be formed (S5').

The provided upper plate CH1 may be reversed to be bonded to a bonded body of the intermediate plate CH2 and the lower plate CH3 (S6). In this instance, a copper to copper (Cu to Cu) bonding may be performed between the first conductive pad CP1 and the second conductive pad CP2.

A backside illumination (BSI) process for forming the antireflective structure AL, the color filters CF1 and CF2, and the micro lenses ML on the rear side 1b of the upper plate CH1 may be performed (S7).

The semiconductor device according to an embodiment may be manufactured by bonding three sub-chips.

FIG. 7A to FIG. 7G show cross-sectional views of sub-division of S1 of FIG. 6. That is, FIG. 7A to FIG. 7G show a detailed process for forming the through via 222 and the second wires 217 after performing a FEOL process on the intermediate plate CH2.

Figure 7A:
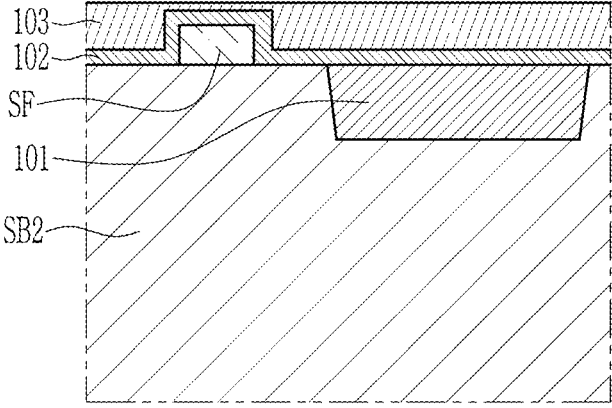
FIG. 7A to FIG. 7G show cross-sectional views of subdivision of S1 of FIG. 6.

Referring to FIG. 7A, a FEOL process on the intermediate plate CH2 (i.e., the second semiconductor layer SB2) is performed to form the source follower gate SF with the first to third front side insulation layers 101, 102, and 103, and a CMP may then be performed to reduce the thickness of the interlayer insulating layer on the uppermost layer.

Figure 7B:
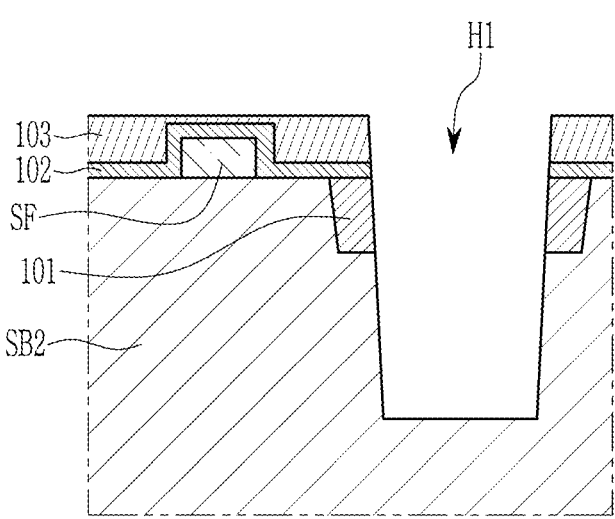

Referring to FIG. 7B, a first hole H1 may be formed at a position in which the through via 222 will be formed according to a photolithography process. For example, as illustrated in FIG. 7B, the first hole H1 may be formed through the first to third front side insulation layers 101, 102, and 103 to penetrate the second semiconductor layer SB2 to a predetermined depth.

Figure 7C:
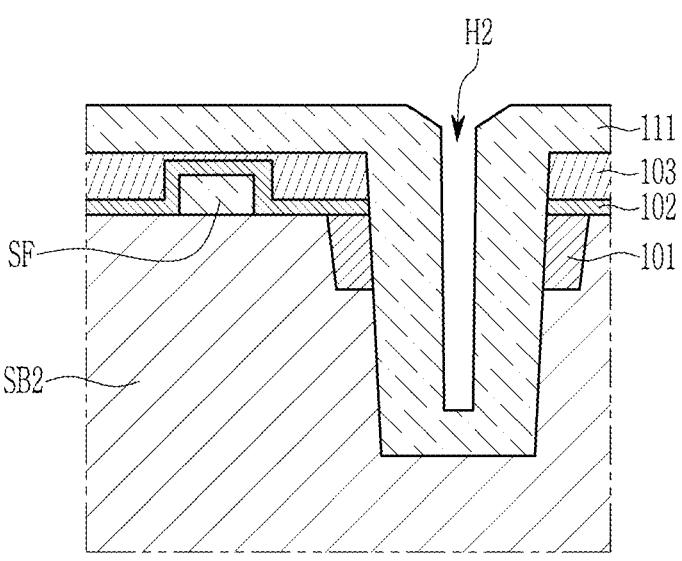

Referring to FIG. 7C, a through hole insulating layer 111 for covering a lateral side and a bottom side of the first hole H1 may be formed by conformally depositing the insulation layer. According to this, a second hole H2 may be formed in the through hole insulating layer 111.

Figure 7D:
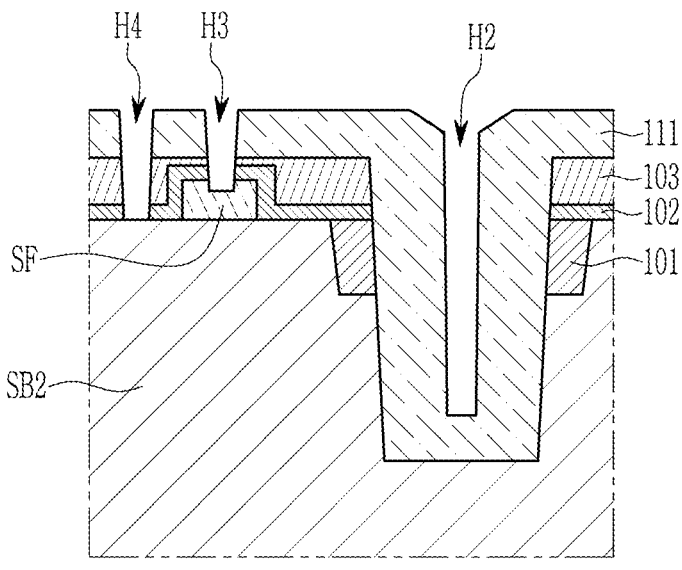

Referring to FIG. 7D, third and fourth holes H3 and H4, in which the via 221 to be connected to the source follower gate SF and the via 223 to be connected to the active region of the second semiconductor layer SB2 are to be subse-quently formed, may be formed by a photolithography process. For example, as illustrated in FIG. 7D, the third and fourth holes H3 and H4 may extend through the through hole insulating layer 111 and the second and third front side insulation layers 102 and 103, with the fourth hole H4 extending into a top portion of the source follower gate SF.

Figure 7E:
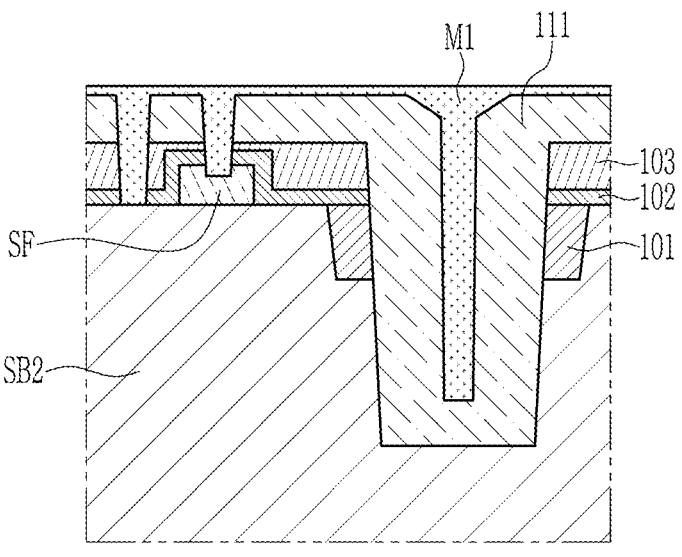

Referring to FIG. 7E, the second to fourth holes H2, H3, and H4 may be filled with a via metal M1 by depositing a metal, e.g., tungsten.

Figure 7F:
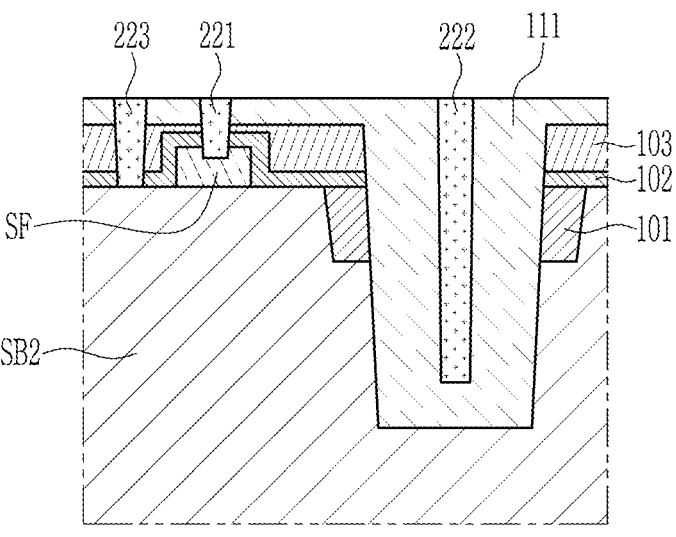

Referring to FIG. 7F, the via metal M1 may be planarized, e.g., by a CMP, until the through via 222 may be separated from the vias 221 and 223. For example, upper surfaces of the through via 222 and the vias 221 and 223 may be exposed, such that the upper surfaces of the through via 222, the vias 221 and 223, and the through hole insulating layer 111 may be coplanar.

Figure 7G:
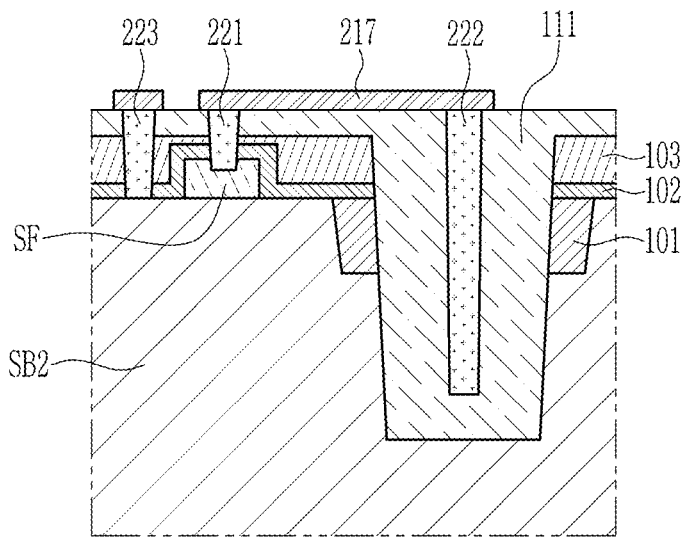

Referring to FIG. 7G, the second wires 217 connected to the through via 222 and the other vias 221 and 223 may be formed on the planarized through hole insulating layer 111. As such, by forming the through vias 222 and the vias 221 and 223, followed by forming the second wires 217 on the exposed upper surfaces of the through vias 222 and the vias 221 and 223, it is easy to make wiring connections with the through via 222 and the vias 221 and 223 even if the width of the second wires 217 is reduced.

FIG. 8A to FIG. 8F show cross-sectional views of sub-division of S5 of FIG. 6. That is, FIG. 8A to FIG. 8F show a detailed process for reducing the thickness of the second semiconductor layer SB2 and forming the second conduc-tive pad CP2. FIG. 8A to FIG. 8F show a portion of the intermediate plate CH2, and omit lower portions of the lower plate CH3 and the intermediate plate CH2.

Figure 8A:
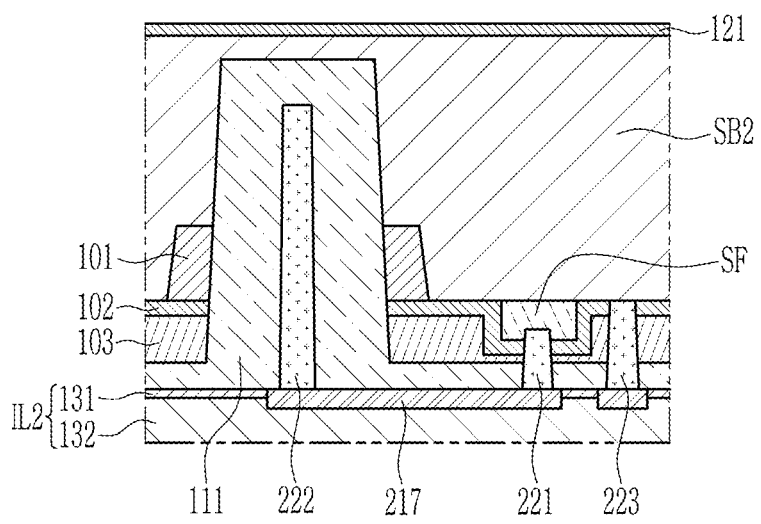
FIG. 8A to FIG. 8F show cross-sectional views of subdivision of S5 of FIG. 6.

Referring to FIG. 8A, the intermediate plate CH2 is reversed and is bonded to the lower plate CH3 so the second semiconductor layer SB2 may be disposed above the second wire 217. A first rear insulation layer 121 may be deposited on the rear side 2b of the thickness-reduced second semi-conductor layer SB2.

Figure 8B:
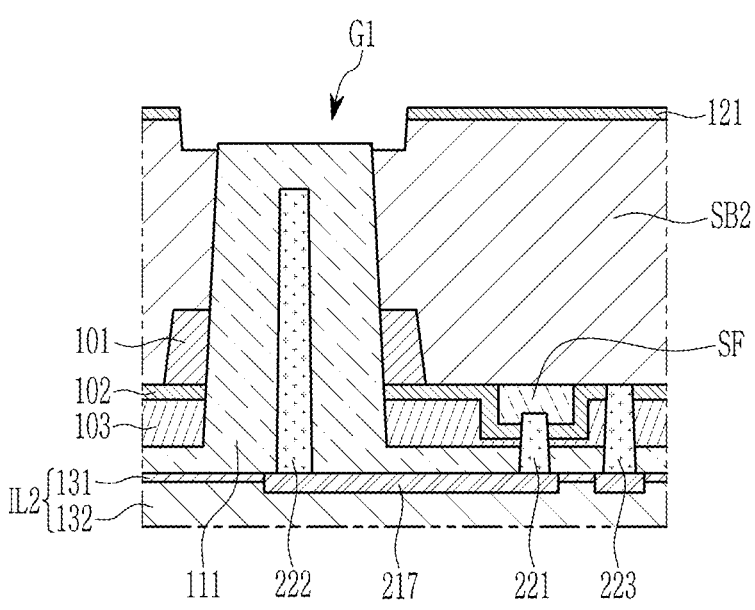

Referring to FIG. 8B, a first groove G1 may be formed in a portion on which the second conductive pad CP2 is to be formed according to the photolithography process. The first groove G1 may be formed by removing parts of the first rear insulation layer 121 and the second semiconductor layer SB2, such that the through hole insulating layer 111 may be exposed through the first groove G1, e.g., a portion of the through hole insulating layer 111 may protrude into the first groove G1 to extend above the bottom of the groove G1.

Figure 8C:
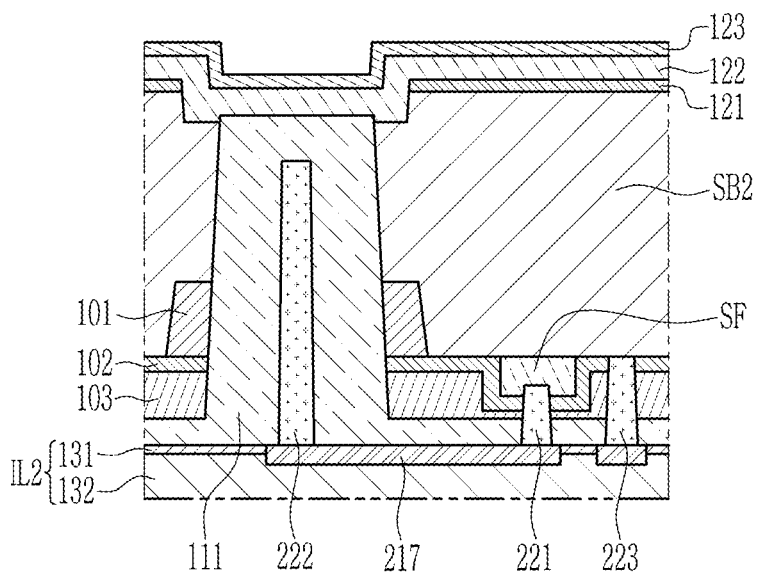

Referring to FIG. 8C, the second rear insulation layer 122 and the third rear insulation layer 123 may be sequentially and conformally deposited on the first rear insulation layer 121 and in the groove G1.

Figure 8D:
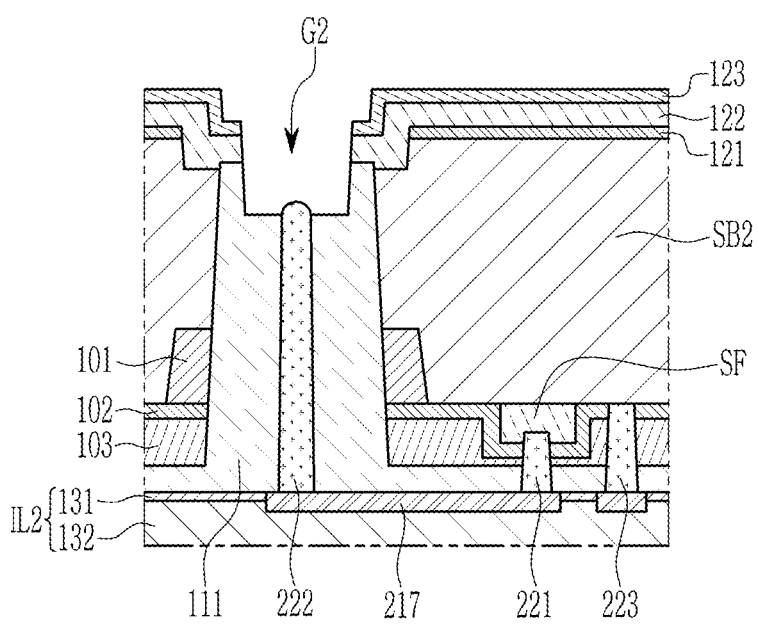

Referring to FIG. 8D, a second groove G2 for exposing the through via 222 may be formed through the second and third rear insulation layers 122 and 123, as well as through an upper portion of the through hole insulating layer 111, by the photolithography process. The second groove G2 may correspond, e.g., vertically overlap, a profile of the first groove G1. An upper end of the through via 222 exposed through the second groove G2 may have round corners, e.g., the upper end of the through via 222 may extend into the second groove G2 above the bottom of the second groove G2.

Figure 8E:
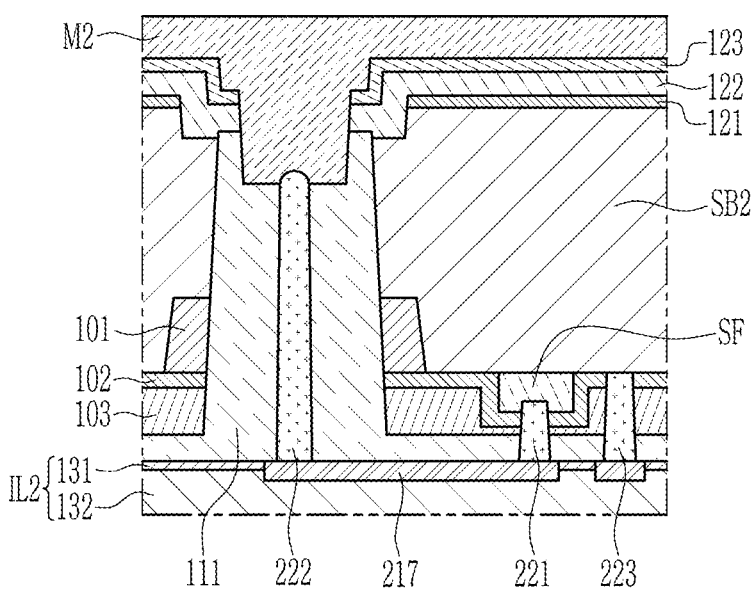

Referring to FIG. 8E, a pad metal layer M2 for filling the second groove G2 may be formed by forming a copper film, e.g., by electroplating.

Figure 8F:
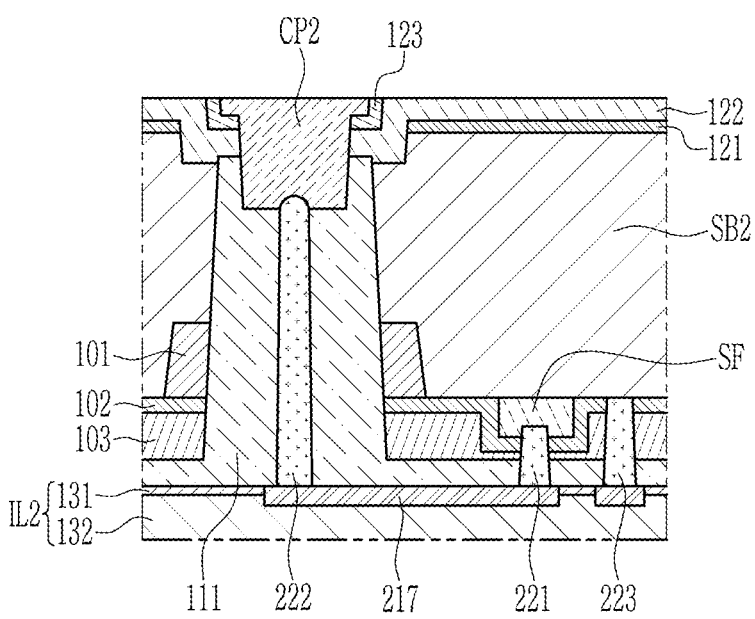

Referring to FIG. 8F, a second conductive pad CP2 may be formed by performing a CMP on the pad metal layer M2, e.g., until upper surfaces of the second and third rear insulation layers 122 and 123 are exposed. In this instance, the third rear insulation layer 123 may also be polished and thereby remaining below and on a lateral side of the second conductive pad CP2.

Figure 9:
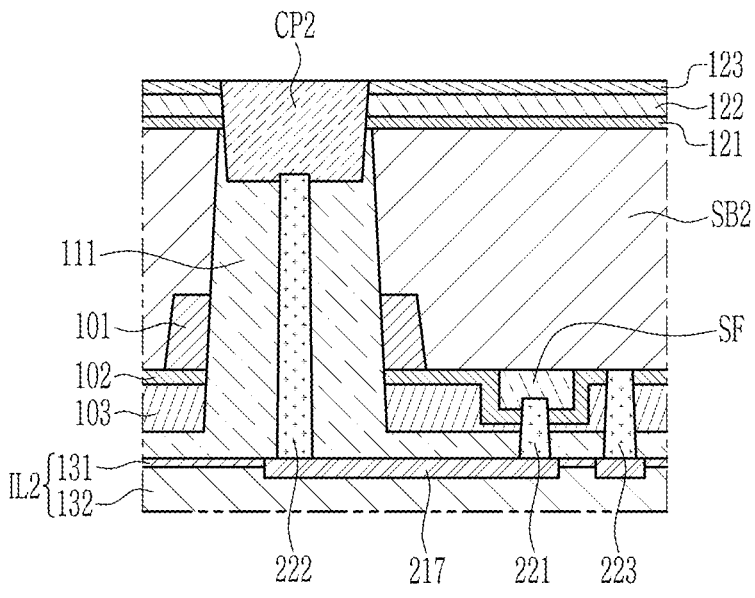
FIG. 9 shows a partly enlarged cross-sectional view of a semiconductor device according to another embodiment.

FIG. 9 shows a partly enlarged cross-sectional view of a semiconductor device according to another embodiment.

Referring to FIG. 9, the embodiment of FIG. 9 has a different cross-sectional structure of the first to third rear insulation layers 121, 122, 123, and the second conductive pad CP2, e.g., compared to the embodiment of FIG. 5. In the embodiment of FIG. 9, the second conductive pad CP2 is formed in the groove by simultaneously piercing the first to third rear insulation layers 121, 122, and 123 and the through hole insulating layer 111, so that the first to third rear insulation layers 121, 122, and 123 may have a substantially coinciding planar pattern, e.g., coplanar sidewalls. There-fore, the second conductive pad CP2 may have a cross-sectional shape that is similar to a simple quadrangle and may have a continuous lateral side.

Figure 10A:
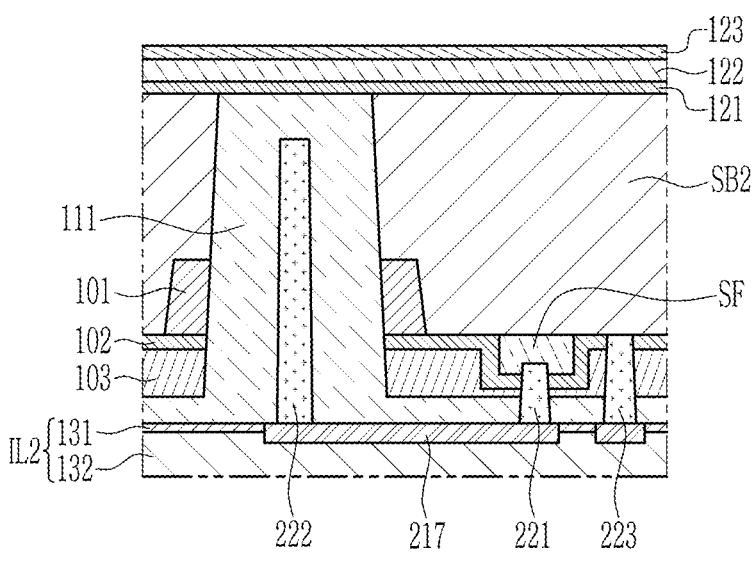
FIG. 10A to FIG. 10C show cross-sectional views of stages in a method for manufacturing the semiconductor device of FIG. 9.
Figure 10B:
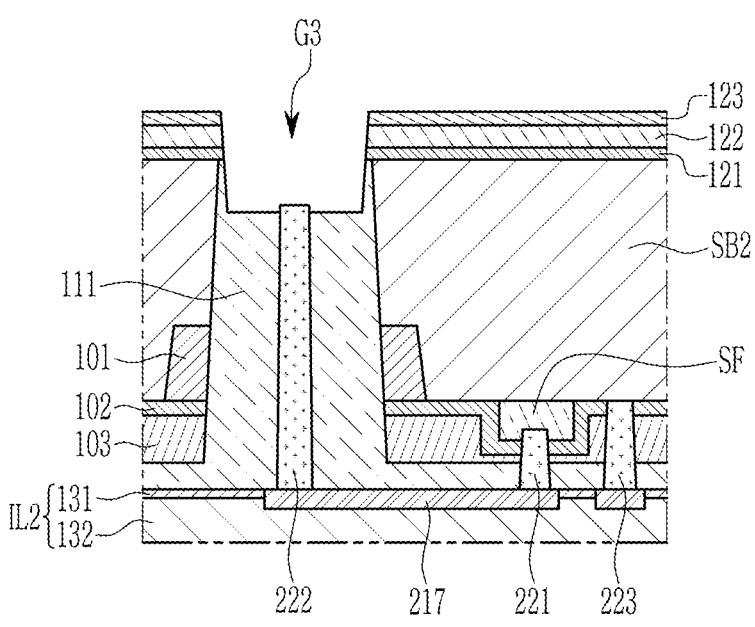
Figure 10C:
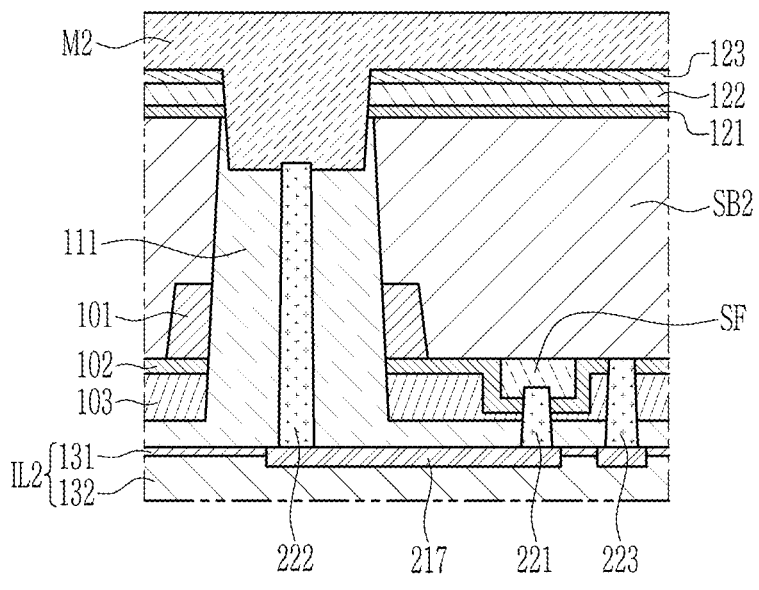

FIG. 10A to FIG. 10C show cross-sectional views of stages in a method for manufacturing the semiconductor device of FIG. 9.

Referring to FIG. 10A, the first to third rear insulation layers 121, 122, and 123 may be sequentially stacked on the rear side 2b of the thickness-reduced second semiconductor layer SB2.

Referring to FIG. 10B, a groove G3 for exposing the through via 222 may be formed by performing the photoli-thography process on the first to third rear insulation layers 121, 122, and 123 and the through hole insulating layer 111.

Referring to FIG. 10C, the pad metal layer M2 filling the groove G3 exposing the through via 222 may be formed by forming a copper film, e.g., by electroplating.

Referring to FIG. 9, the second conductive pad CP2 may be formed by performing a CMP on the pad metal layer M2.

Figure 11:
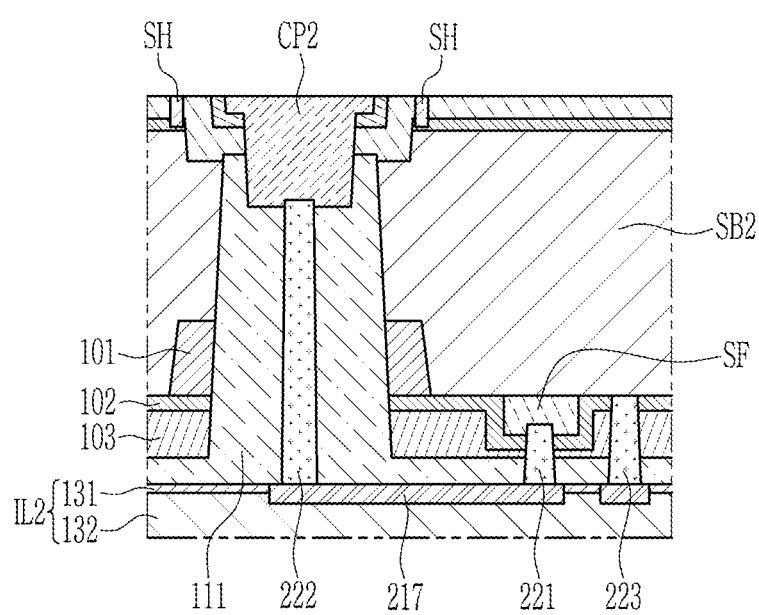
FIG. 11 shows a partly enlarged cross-sectional view of a semiconductor device according to another embodiment.

FIG. 11 shows a partly enlarged cross-sectional view of a semiconductor device according to the other embodiment.

Referring to FIG. 11, the embodiment of FIG. 11 is different from the embodiment of FIG. 5 in that a shielding conductor SH is disposed around the second conductive pad CP2. The shielding conductor SH may include copper in a like way of the second conductive pad CP2. The shielding conductor SH may surround the second conductive pad CP2 to reduce generation of electrical interference between peripheral wires or electronic elements.

Figure 12A:
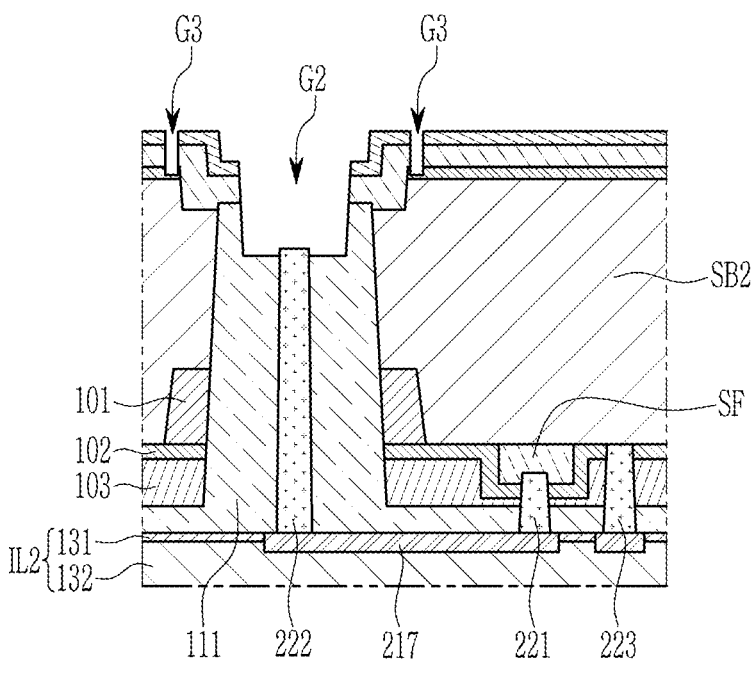
FIG. 12A and FIG. 12B show cross-sectional views of stages in a method for manufacturing the semiconductor device of FIG. 11.
Figure 12B:
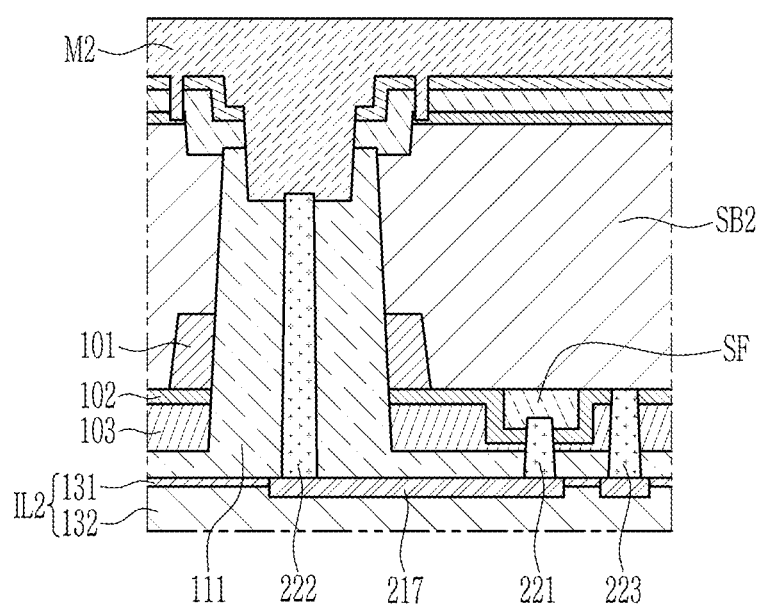

FIG. 12A and FIG. 12B show cross-sectional views of stages in a method for manufacturing the semiconductor device of FIG. 11. The processes of FIGS. 8A-8C may be performed before FIG. 12A.

Referring to FIG. 12A, a second groove G2 for exposing the through via 222 and a third groove G3 for exposing the first rear insulation layer 121 may be formed by the photolithography process. For example, the third groove G3 may be formed around a circumference of the second groove G2.

Referring to FIG. 12B, the pad metal layer M2 for filling the second groove G2 and the third groove G3 (i.e., a shielding groove) may be formed by forming a copper film, e.g., by electroplating, in the second and third grooves G2 and G3.

Referring to FIG. 11, the second conductive pad CP2 and the shielding conductor SH may be formed by performing a CMP on the pad metal layer M2.

By way of summation and review, embodiments provide a semiconductor device with increased freedom of disposing wires. That is, according to embodiments, a wire connected to the substrate through a via may be disposed with an increased accuracy at a predetermined position, thereby facilitating area reduction the wire. Accordingly, the disposition freedom of wires may be increased. Further, the parasitic capacitance generated between the through via and the substrate and between the through via and the wire may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a first substrate having a first side and a second side that is opposite to the first side, the first substrate including:
a first semiconductor layer with a first electronic element therein,
a first insulation layer on the first semiconductor layer,
a first conductive pad in the first insulation layer and exposed through the first side, and
a first wire in the first insulation layer, the first semiconductor layer being connected to the first wire; and
a second substrate attached to the first side of the first substrate, the second substrate including:
a second semiconductor layer with a second electronic element therein,
a second insulation layer on the second semiconductor layer,
a second wire in the second insulation layer,
a through via penetrating the second semiconductor layer and connected to the second wire, and a second conductive pad connecting the through via and the first conductive pad of the first substrate, at least a part of the second conductive pad being in the second semiconductor layer.

2. The semiconductor device as claimed in claim 1, wherein a width of a cross-section of the through via is reduced when approaching the second conductive pad, and a width of a cross-section of the second conductive pad is reduced when approaching the through via.

3. The semiconductor device as claimed in claim 2, wherein the second conductive pad includes an upper end with an increasing width in a stepped way.

4. The semiconductor device as claimed in claim 1, wherein:
the second substrate further includes a first rear insulation layer, a second rear insulation layer, and a third rear insulation layer on the second semiconductor layer,
the first rear insulation layer and the second semiconductor layer have a first groove penetrating the first rear insulation layer and extending into at least a portion of the second semiconductor layer,
the second rear insulation layer is on a lateral side and a bottom side of the first groove and on an upper surface of the first rear insulation layer, the second rear insulation layer having a second groove corresponding to a profile of the first groove, and
the third rear insulation layer is in the second groove, the third rear insulation layer being between the second conductive pad and the second rear insulation layer.

5. The semiconductor device as claimed in claim 4, wherein the second conductive pad includes an upper end with an increasing width in a stepped way.

6. The semiconductor device as claimed in claim 5, wherein the second conductive pad penetrates the third rear insulation layer and the second rear insulation layer, the second conductive pad being connected to the through via.

7. The semiconductor device as claimed in claim 1, wherein the second substrate further includes:
a first rear insulation layer, a second rear insulation layer, and a third rear insulation layer on the second semiconductor layer, and
a through hole insulating layer between the second semiconductor layer and the through via and between the second semiconductor layer and the second conductive pad.

8. The semiconductor device as claimed in claim 7, wherein the second conductive pad penetrates the first to third rear insulation layers and the through hole insulating layer, the second conductive pad being connected to the through via.

9. The semiconductor device as claimed in claim 7, wherein:
the first rear insulation layer and the second semiconductor layer have a first groove penetrating the first rear insulation layer and extending into at least a portion of the second semiconductor layer,
the second rear insulation layer is on a lateral side and a bottom side of the first groove and on an upper surface of the first rear insulation layer, the second rear insulation layer having a second groove corresponding to a profile of the first groove, and
the third rear insulation layer is in the second groove and is between the second conductive pad and the second rear insulation layer.

10. The semiconductor device as claimed in claim 9, wherein the second conductive pad penetrates the third rear insulation layer, the second rear insulation layer, and the through hole insulating layer, the second conductive pad being connected to the through via.

11. The semiconductor device as claimed in claim 1, wherein the second substrate further includes:

a first via connecting the second semiconductor layer and the second wire;

a source follower gate electrode below the second semiconductor layer; and a second via connecting the source follower gate electrode and the second wire.

12. The semiconductor device as claimed in claim 11, wherein the second substrate further includes:

a first rear insulation layer, a second rear insulation layer, and a third rear insulation layer on the second semiconductor layer, and a through hole insulating layer between the through via and the second semiconductor layer, between the second semiconductor layer and the second conductive pad, and between the second wire and the second semiconductor layer, the first via and the second via penetrating the through hole insulating layer.

13. The semiconductor device as claimed in claim 1, wherein:

the first electronic element includes a photodiode, and the first substrate further includes an antireflective structure and a color filter on the first semiconductor layer.

14. The semiconductor device as claimed in claim 13, wherein:

the first substrate further includes a floating diffusing region and a transmission gate, and the second substrate includes a source follower gate and a selection gate.

15. The semiconductor device as claimed in claim 14, wherein the source follower gate is connected to the floating diffusing region through the through via and the second conductive pad.

16. The semiconductor device as claimed in claim 1, further comprising a third substrate attached to the second insulation layer of the second substrate, the third substrate including:

a third semiconductor layer with a third electronic element, a third insulation layer on the third semiconductor layer, and a third wire provided in the third insulation layer.

17. A semiconductor device, comprising:

a first semiconductor substrate having a first side and a second side that is opposite to the first side, the first semiconductor substrate including a pixel array region and an edge region;

an antireflective structure on the second side of the first semiconductor substrate;

a pixel separator on the first semiconductor substrate and separating pixels;

a color filter on the antireflective structure;

a micro lens array on the color filter;

a first interlayer insulating layer on the first side of the first semiconductor substrate;

a first wiring layer in the first interlayer insulating layer;

a second semiconductor substrate below the first interlayer insulating layer;

a second interlayer insulating layer below the second semiconductor substrate;

a second wiring layer in the second interlayer insulating layer;

a third interlayer insulating layer below the second interlayer insulating layer;

a third wiring layer below the third interlayer insulating layer;

a third semiconductor substrate below the third interlayer insulating layer;

a through via and a conductive pad penetrating the second semiconductor substrate and connecting the second wiring layer to the first wiring layer; and a through hole insulating layer between the conductive pad and the second semiconductor substrate and between the through via and the second semiconductor substrate.

18. A method for manufacturing a semiconductor device, the method comprising:

performing a front end of line process on a semiconductor substrate having a first side and a second side that is opposite to the first side;

forming an interlayer insulating layer on the first side of the semiconductor substrate;

forming a first hole penetrating the interlayer insulating layer and extending into at least a portion of the semiconductor substrate;

conformally depositing an insulating material on the interlayer insulating layer and the first hole, such that a through hole insulating layer covering a lateral side and a bottom side of the first hole is formed, and a second hole overlapping the first hole is formed on the through hole insulating layer;

forming a via metal layer filling the second hole;

forming a through via by polishing the via metal layer;

forming a wire on the through via;

forming first to third rear insulation layers on the second side of the semiconductor substrate;

forming a groove penetrating the first to third rear insulation layers and the through hole insulating layer and exposing the through via; and forming a conductive pad filling the groove.

19. The method as claimed in claim 18, wherein forming the first to third rear insulation layers on the second side of the semiconductor substrate includes:

forming a first rear insulation layer on the second side of the semiconductor substrate;

forming a first groove for exposing the through hole insulating layer by performing a photolithography process on the first rear insulation layer and the semiconductor substrate, and sequentially stacking the second and third rear insulation layers on the first rear insulation layer.

20. The method as claimed in claim 19, further comprising, when the groove penetrating the first to third rear insulation layers and the through hole insulating layer and exposing the through via is formed:

forming a shielding groove around a circumference of the groove, and forming a shielding conductor filling the shielding groove along with the conductive pad for filling the groove.

* * * * *